United States Patent
Kolb et al.

(10) Patent No.: US 10,246,325 B2
(45) Date of Patent: Apr. 2, 2019

(54) MEMS DEVICE AND METHOD FOR MANUFACTURING A MEMS DEVICE

(71) Applicant: Infineon Technologies AG, Neubiberg (DE)

(72) Inventors: Stefan Kolb, Unterschleissheim (DE); Andreas Meiser, Sauerlach (DE); Till Schloesser, Munich (DE); Wolfgang Werner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/832,001

(22) Filed: Aug. 21, 2015

(65) Prior Publication Data
US 2016/0060105 A1    Mar. 3, 2016

Related U.S. Application Data

(60) Provisional application No. 62/045,289, filed on Sep. 3, 2014.

(51) Int. Cl.
*B81B 3/00*   (2006.01)
*B81C 1/00*   (2006.01)
*H01L 21/00*  (2006.01)

(52) U.S. Cl.
CPC .... *B81C 1/00182* (2013.01); *B81C 2201/019* (2013.01)

(58) Field of Classification Search
CPC ......... H01L 21/02381; H01L 21/02505; H01L 21/02513; H01L 21/02521; H01L 21/8221;
(Continued)

(56) References Cited

U.S. PATENT DOCUMENTS 5,670,798 A * 9/1997 Schetzina ............. H01L 29/205
257/101
7,438,760 B2 * 10/2008 Bauer ..................... C23C 16/04
117/102
(Continued)

FOREIGN PATENT DOCUMENTS

CN       1705138 A    12/2005
CN     101850943 A    10/2010
(Continued)

OTHER PUBLICATIONS

Office Action dated Sep. 23, 2016 for Chinese Patent Application No. 201510553886.7.
(Continued)

*Primary Examiner* — Natalia A Gondarenko
(74) *Attorney, Agent, or Firm* — Schiff Hardin LLP

(57) ABSTRACT

A method for producing a MEMS device comprises forming a semiconductor layer stack, the semiconductor layer stack comprising at least a first monocrystalline semiconductor layer, a second monocrystalline semiconductor layer and a third monocrystalline semiconductor layer, the second monocrystalline semiconductor layer formed between the first and third monocrystalline semiconductor layers. A semiconductor material of the second monocrystalline semiconductor layer is different from semiconductor materials of the first and third monocrystalline semiconductor layers. After forming the semiconductor layer stack, at least a portion of each of the first and third monocrystalline semiconductor layers is concurrently etched.

29 Claims, 15 Drawing Sheets

(58) Field of Classification Search
CPC ......... H01L 21/56; H01L 29/84; H01L 21/20;
H01L 21/44; H01L 21/50; H01L 2924/00;
H01L 2924/14; H01L 2924/15153; H01L
2924/10253; H01L 2924/1461; H01L
2224/05552; H01L 2224/80001; H01L
21/76264; H01L 21/764; H01L 23/538;
H01L 23/5381; H01L 25/0652; H01L
21/221; H01L 21/02592; H01L 41/0815;
H01L 41/094; H01L 21/823481; H01L
21/3213; H01L 21/30604; H01L
21/30612; H01L 21/84; H01L 21/762;
H01L 21/31111; H01L 21/02178; H01L
21/02532; H01L 23/34; G01P 15/125;
B81C 1/00; B81C 1/00341; B81C
1/00134; B81C 99/00–99/0095; B81C
2201/00–2201/117; B81C
2203/00–2203/0792; B81C
1/00523–1/00571; B81C
1/00841–1/00857; B81C 1/00587; B81C
1/00595; B81C 2201/0198; B81C
2201/0156–2201/0159; B81C
2201/0101–2201/016; B81C
1/00388–1/00634; B81C 1/0015; B81C
1/00103; B81C 1/00119; B81C 1/00095;
B81C 1/00031; B81C 1/00023–1/00126;
B81C 1/00246; B81C 1/0069; B81C
1/00698; B81C 1/0065–1/00682; B81C
1/00055–1/00087; B81C 1/00936; B81C
1/00944; B81C 2203/0707–2203/0778;
B81C 1/00158; B81C 2201/013; B81C
2203/036; B81B 3/0018; B81B 3/0027;
B81B 1/00–1/008; B81B 3/00–3/0097;
B81B 5/00; B81B 7/00–7/04; B81B
2201/00–2201/13; B81B
2203/00–2203/06; B81B
2207/00–2207/996; B81B 3/0059; B81B
2203/0127; B81B 2201/0264; B81B
2203/0315; G01L 9/00; G01L 9/06; H01C
10/20; H01C 10/10

USPC ......... 257/415, 417, 470, E29.324, E29.347,
257/E21.231, E21.502, E21.002; 438/51,
438/50, 54, 57, 482, 19, 760, 29, 46, 478
See application file for complete search history.

(56) References Cited

U.S. PATENT DOCUMENTS

| | | | |
|---|---|---|---|
| 2004/0248344 A1* | 12/2004 | Partridge | B81C 1/00333 438/127 |
| 2005/0019974 A1* | 1/2005 | Lutz | B81B 3/0054 438/52 |
| 2007/0196973 A1* | 8/2007 | Park | H01L 21/82341 438/197 |
| 2009/0170231 A1* | 7/2009 | Robert | B81C 1/00484 438/50 |
| 2009/0267166 A1* | 10/2009 | Verheijden | B81C 1/00476 257/415 |
| 2010/0006840 A1* | 1/2010 | Robert | B81C 1/00039 257/49 |
| 2012/0142170 A1* | 6/2012 | Teng | B82Y 20/00 438/478 |
| 2014/0003458 A1* | 1/2014 | Han | H01L 21/30612 372/45.01 |
| 2014/0264278 A1* | 9/2014 | Bennett | H01L 29/365 257/24 |
| 2015/0372119 A1* | 12/2015 | Zhang | B82Y 10/00 438/268 |

FOREIGN PATENT DOCUMENTS

| | | |
|---|---|---|
| CN | 102730623 A | 10/2012 |
| DE | 4106288 A1 | 9/1992 |

OTHER PUBLICATIONS

Office Action dated Mar. 2, 2017 for German Patent Application No. 102015114035.7.

* cited by examiner

MEMS DEVICE AND METHOD FOR MANUFACTURING A MEMS DEVICE

CROSS REFERENCE TO RELATED APPLICATION

This application is a Non Provisional of U.S. Provisional Patent Application Ser. No. 62/045,289, which was filed September. This application is incorporated herein by reference in its entirety.

TECHNICAL FIELD

Embodiments described herein relate to microelectromechanical systems (MEMS) devices and methods to manufacture MEMS devices.

BACKGROUND

MEMS is a technology of very small mechanical structures on a microscale or nanoscale. A movement of the mechanical structures of MEMS devices is typically sensed or actuated by electrical signals. MEMS devices are typically manufactured on or within semiconductor substrates or other materials. MEMS devices can be used in a variety of applications such as pressure sensors, accelerometers and gyroscopes. Typically, MEMS devices made from silicon are fabricated by polysilicon processes which results in a movable element having a polycrystalline structure. In view of this, there is a need for an improved MEMS technology which allows improved manufacturing of MEMS devices with a monocrystalline movable element.

SUMMARY

According to an embodiment, a method for producing a MEMS device comprises forming a semiconductor layer stack, the semiconductor layer stack comprising at least a first monocrystalline semiconductor layer, a second monocrystalline semiconductor layer and a third monocrystalline semiconductor layer, the second monocrystalline semiconductor layer formed between the first and third monocrystalline semiconductor layers. A semiconductor material of the second monocrystalline semiconductor layer is different from semiconductor materials of the first and third monocrystalline semiconductor layers. After forming the semiconductor layer stack, at least a portion of each of the first and third monocrystalline semiconductor layers is concurrently etched.

According to a further embodiment, a MEMS device comprises a movable MEMS element comprising a monocrystalline semiconductor material and a non-movable semiconductor layer stack lateral to the movable MEMS element. The semiconductor layer stack comprises at least a first monocrystalline semiconductor layer, a second monocrystalline semiconductor layer and a third monocrystalline semiconductor layer, the second monocrystalline semiconductor layer formed between the first and third monocrystalline semiconductor layers. A gap structure surrounds the movable MEMS element and separates the movable MEMS element in lateral directions from the layer stack.

According to a further embodiment, a method of producing vertically stacked MEMS devices comprises forming a semiconductor layer stack, the semiconductor layer stack comprising a first plurality of monocrystalline semiconductor layers of a first semiconductor material and a second plurality of monocrystalline semiconductor layers of a second semiconductor material, such that a first one of the first plurality of monocrystalline semiconductor layers is formed between a first pair of the second plurality of monocrystalline semiconductor layers and a second one of the first plurality of monocrystalline semiconductor layers is formed between a second pair of the second plurality of semiconductor layers. Thereafter, a portion of each layer of the second plurality of monocrystalline semiconductor layers is concurrently etched.

DETAILED DESCRIPTION

Figure 1A:
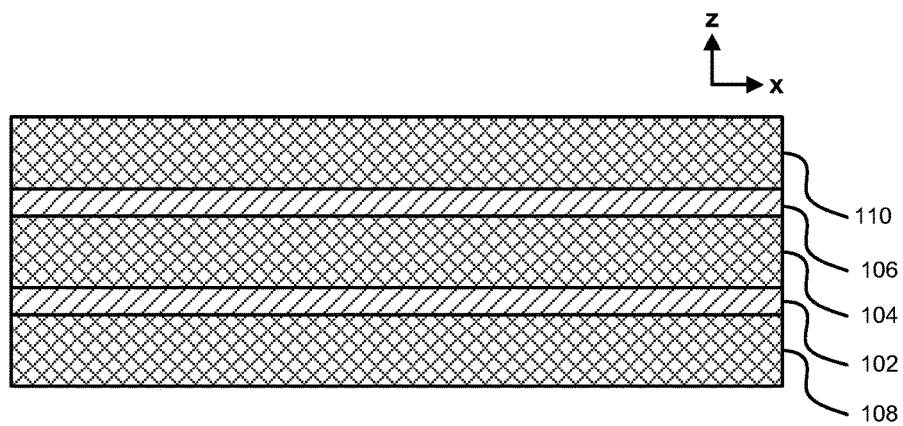
FIGS. 1A to 1D show cross-sectional views of an embodiment for manufacturing a MEMS device at various stages.

The following detailed description explains exemplary embodiments of the present invention. The description is not to be taken in a limiting sense, but is made only for the purpose of illustrating the general principles of embodiments of the invention while the scope of protection is only determined by the appended claims.

It is to be understood that the features of the various exemplary embodiments described herein may be combined with each other, unless specifically noted otherwise.

In the various figures, identical or similar entities, modules, devices etc. may have assigned the same reference number. Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

In the described embodiments, various specific views or schematic views of elements, devices, features, etc. are shown and described for a better understanding of embodiments. It is to be understood that such views may not be drawn to scale. Furthermore, such embodiments may not show all features, elements etc. contained in one or more figures with a same scale, i.e. some features, elements etc. may be shown oversized such that in a same figure some features, elements, etc. are shown with an increased or decreased scale compared to other features, elements etc.

It will be understood that when an element is referred to as being "on," "between", "connected to," "electrically connected to," or "coupled to" to another component, it may be directly on, between, connected to, electrically connected to, or coupled to the other component or intervening components may be present. In contrast, when a component is referred to as being "directly on," "directly connected to,"

"directly electrically connected to," or "directly coupled to" another component, there are no intervening components present. As used herein, the term "and/or" includes any and all combinations of one or more of the associated listed items.

Spatially relative terms, such as "vertical", "lateral" "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

Embodiments described below are directed to a new concept to manufacture a MEMS device. The described embodiments allow manufacturing of a MEMS device having a movable MEMS element of moncrystalline structure.

Referring to FIGS. 1A-1D, a first embodiment showing various stages of the manufacturing process of a MEMS device will be described. FIGS. 1A-1D show cross sectional views along a x-z plane which is perpendicular to a main surface of the MEMS device. Starting at FIG. 1A, a vertical layer stack of monocrystalline layers comprising semiconductor layers 102, 104 and 106 of monocrystalline structure is provided. The layer stack shown in FIG. 1A may in a lateral direction continuously extend from one wafer edge to another edge or may be provided in predefined or preselected areas of a wafer. In the stack, the layer 104 is provided above the layer 102 and the layer 106 is provided above the layer 104. The semiconductor layers 102, 104 and 106 may each have a thickness between X and Y μm. In some embodiments, the layers 102 and 106 may be thinner than the layer 104.

It is to be noted that in embodiments, the layer stack can be formed on regular silicon or other semiconductor wafers without requiring the use of SOI substrates. Thus, the embodiments described below allow the forming of monocrystalline MEMS devices without using SOI (silicon on insulator) wafers which are typically more expensive than regular semiconductor wafers.

The semiconductor layers 102, 104 and 106 may be epitaxial grown layers. The layer 102 may be epitaxial grown on a layer 108 below layer 102. Layer 108 may be a bulk semiconductor layer such as a bulk semiconductor wafer. Furthermore, the layer 104 may be epitaxial grown on the layer 102 and the layer 106 may be epitaxial grown on the layer 104.

A further layer 110 is provided above layer 106 such that the layers 102, 104 and 106 are sandwiched between the layer 108 and the layer 110. The layer 110 may in some embodiments have a monocrystalline structure. The layer 110 may in some embodiments have a non-monocrystalline structure such as a polycrystalline or amorphous structure. The layers 102, 104 and 106 may be formed such that the crystalline structures of adjacent layers are formed of different materials. For example, according to an embodiment, the layer 102 and 106 may be formed of a same semiconductor material while the layer 104 may be formed of a semiconductor material different to the layers 102 and 106. In other embodiments, each of the layer 102, 104 and 106 may be formed of mutual different semiconductor material. The materials of the layers 102 and 106 may be selected to have a good etching selectivity against the material of the layer 104. In other words, the material of the layers 102 and 106 may be selected such that the layers 102 and 106 can be etched selective to the layer 104 such that the layer 104 is not or barely etched when the material of the layers 102 and 106 is etched. In some embodiments, a semiconductor crystal structure of the layers 102 and 106 may have a lattice constant (dimension of the repeating element of the crystal structure) which is different to a lattice constant of the semiconductor crystal structure of the layer 104.

In some embodiments, the layers 102 and 106 may be formed of a compound semiconductor material while the layer 104 is formed of a non-compound semiconductor material. Compound semiconductor materials are semiconductor materials which have a lattice structure comprising two or more different chemical elements such as silicon germanium (SiGe), gallium arsenide (GaAs) etc. In some embodiments, the crystal structure of the layer 104 may be a non-compound material formed by a lattice arrangement of first atoms (e.g. silicon) and a crystal structure of the compound semiconductor material of the layers 102 and 106 is formed by a lattice arrangement of the first atoms and second atoms (e.g. silicon and germanium). Thus, the layers 102 and 106 may be formed in some embodiments of silicon germanium and the layer 104 may be may be formed of silicon. In some embodiments, it may be vice versa, i.e. the layers 102 and 106 may be formed of a non-compound semiconductor material and the layer 104 may be formed of a compound semiconductor material. It is to be understood that in some embodiments, the layers 102, 104 and 106 may be intentionally or unintentionally doped with a dopant (doping agent), e.g. during the growing of the layer or after the growing of the layer. In some embodiments, adjacent layers of the layers 102, 104 and 106 may be doped with a mutual different doping type, e.g. the layers 102 and 106 may be p-doped and layer 104 may be n-doped, or vice versa.

In some embodiments, the layer 108 may be a semiconductor bulk substrate which is significantly thicker (e.g. 10 times) than the layers 102, 104 and 106. In some embodiments, the layer 108 may be a semiconductor layer provided on a substrate. In embodiments, the layers 102, 104 and 106 extend parallel to a main surface of the substrate. The layer 108 is in some embodiments formed from the same material as the layer 104. Furthermore the layer 110 may be formed from the same material as layer 104 such that layers 102 and 106 can be etched selective to the layers 104, 108 and 110.

Figure 1B:
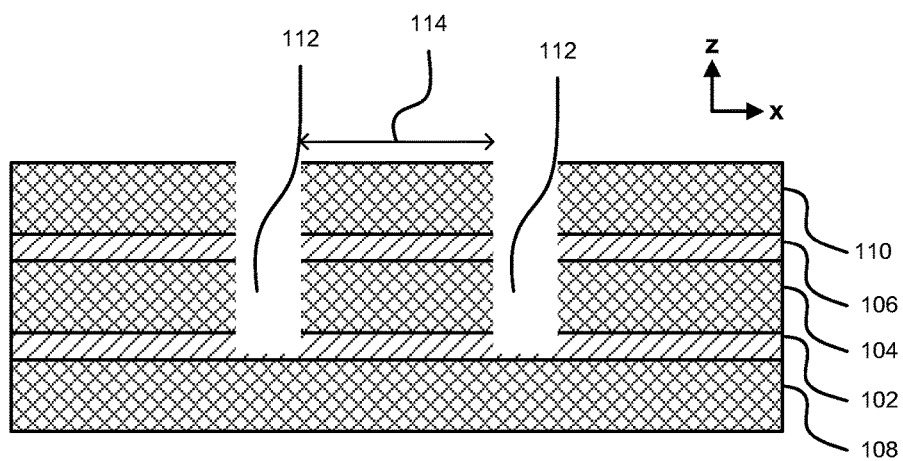

Referring now to FIG. 1B, after the forming of layers 102 to 110, channel structures 112 are etched in the layer stack. As can be seen from FIG. 1B, the channel structures 112 extend in a vertical direction from the top of the layer 110 through the layers 106 and 104. In some embodiments, the channel structures 112 may extend at least partially into the layer 102 or may extend fully throughout the layer 102. A ratio of a channel width of the channel structures 112 to a thickness of the layer 102 or the layer 106 may be may in some embodiments within a range between 1 and 5. Such ratios may for example provide sufficient etching rates for the layers 102 and 106 while good control of the etching is obtained when no etch stops are used lateral of the layers 102 and 106. Furthermore, such ratios allow sufficient lateral gap distances for the movable element as will be explained later.

Etching of the channel structures 112 is performed such that a layer stack portion 114 of the layer 104 extends between channel structures 112. It is to be understood that predefined mask structures may be deposited and structured prior to the etching of the channel structures 112 in order to etch the channel structures 112 into the layer stack. The mask structures may be removed after the channels structures 112 have been etched.

Figure 1C:
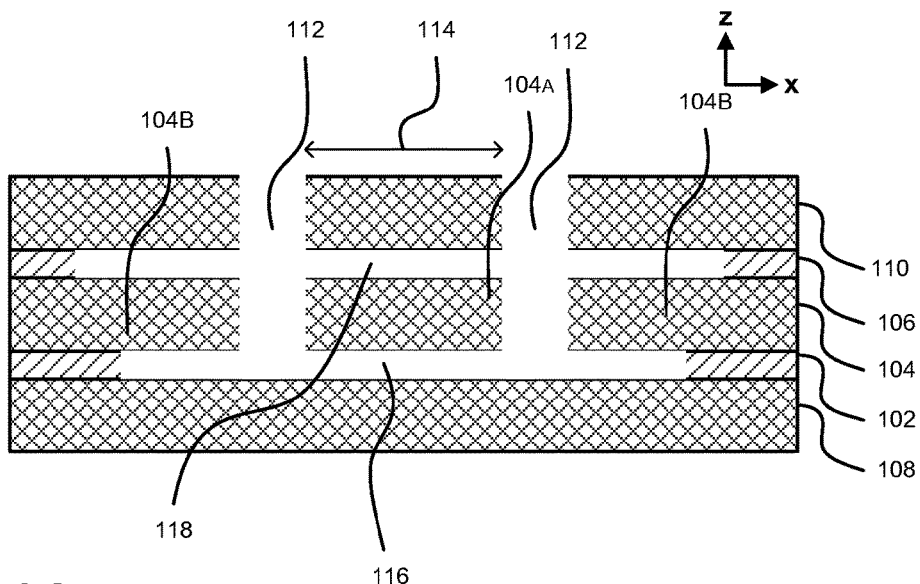

In a next step shown in FIG. 1C, a selective etching of the layers 102 and 106 is performed to remove at least a portion of the layer 102 and a portion of the layer 106. The etchant for etching the layers 102 and 106 is provided via the channel structures 112. Since the etchant is provided from the top of the layer stack, i.e. from the top surface of the layer 110, and in view of the layer 106 being closer to the top than the layer 102, a greater portion is etched in the layer 106 than in the layer 102. In the embodiment shown, no etch stops are provided in a direction lateral of the layers 102 and 106 to stop the etching of the layers 102 and 106 in lateral directions. Therefore, the extension of the portions removed in the layers 102 and 106 in a lateral direction are defined only by the etching time and the etch rate.

In the embodiment, the layers 102 and 106 are completely removed in the portion 114 of the layer stack between the channel structures 112. In the portion 114 of the layer stack, a first gap 116 is generated between the layer 108 and the layer 104 by the removing of the layer 102 in the layer stack portion 114. Furthermore, a second gap 118 is generated between the layer 104 and the layer 110 by the removing of the layer 106 in the layer stack portion 114. As a result of the selective etching, a portion 104A of the layer 104 forming a movable element of the MEMS device is released and the portion 104A is thereafter a movable element 104A. Furthermore, portions 104B lateral to the movable element 104A and separated by the channel structures 112 remain after the selective etching and form non-movable portions 104B of the layer 104.

Figure 1D:
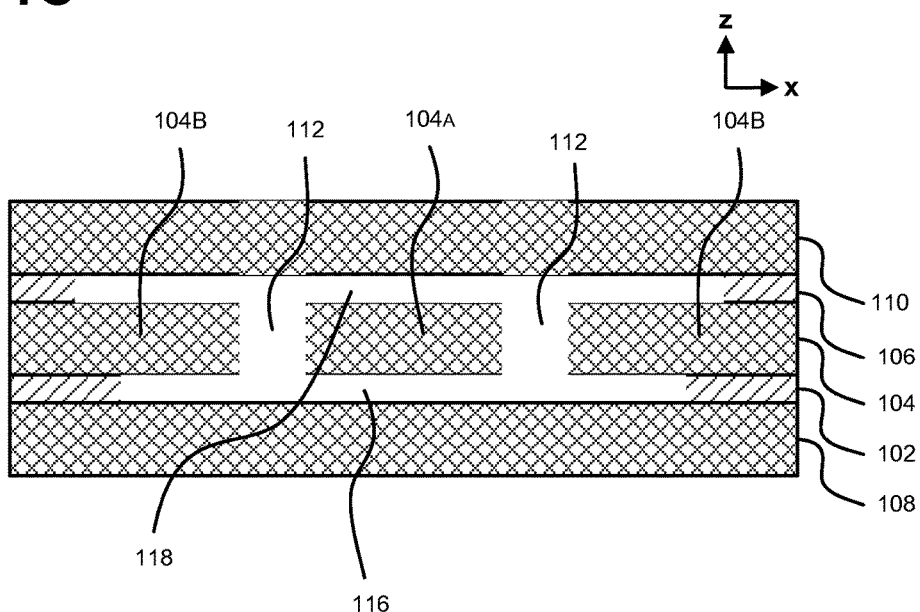

FIG. 1D shows the MEMS device after a sealing process is applied for sealing holes generated by the channel structures 112 in the layer 110. In the embodiment shown in FIG. 1D, the layer 110 is sealed with monocrystalline material, e.g. by epitaxial deposition of monocrystalline semiconductor material. This allows the manufacturing of a further vertically stacked MEMS device as will be described with respect to FIGS. 7A to 7E. It is to be noted, however, that the sealing process can include other sealing processes such as the deposition of poly-crystalline material or other material. In some embodiments, an etching process may be applied after the sealing process to obtain a plain surface. In some embodiments, the sealing provides a hermetically sealed cavity including the movable element. A hermetically sealed cavity allows the movable element to move at low pressures thereby reducing damping and other effects caused by ambient air.

As can be seen from FIG. 1D, the channel structures 112 define a lateral gap between the movable element 104A and the non-movable portions 104B of the layer 104. The channel structures 112 thus are not only used for providing the etchant for the selective etching to the layers 102 and 106 but also define the lateral gap between the movable element 104A and the non-movable portions of the layer 104 which allows the movable element 104A to move in lateral directions and for example to sense a variation of the distance between the movable element 104A and the non-movable portions 104B of the layer 104.

The movable element 104A can have a variety of forms and structures depending on the type of MEMS device and the application. The movable element 104A may include any element which is capable of a mechanical movement of the entire element or portions of the element relative to non-movable portions of the MEMS device such as the non-movable portions 104B or a substrate. The mechanical movement may include movements resulting from mechanical forces acting on the MEMS device such as an acceleration or rotation. In such application the movement of the movable element 104A can be sensed and a quantity representing the physical act can be determined based on the sensed movement. The mechanical movement may also include movements which are induced by the MEMS device itself for example by applying electric drive signals to induce such movements. The MEMS device may be a sensor, an actuator or an oscillator for example to provide timing applications. The mechanical movement may be a rotational movement, a linear movement, a flexure movement, a strain movement, a stress movement, a compression movement or other types of mechanical movements. The movable element 104A may be a beam or cantilever which is anchored at one or more anchor portions to allow a rotational movement around the anchor portions or a movement between two anchor portions or a flexure of the beam. The movable element 104A may include specific structures such as a finger structure to allow capacitive sensing of the movement with high signal strength. The finger structure may be arranged interdigital with a finger structure of the non-movable portions. The movable element 104A may in some embodiments include membrane-like elements capable to bend or deform in response to mechanical forces or applied electric signals.

In some embodiments, the movable element 104A may be capable of moving only in one dimension. In some embodiments the movable element may be capable to move in two dimensions. In some embodiments, the movable element 104A may be capable to move in three dimensions. In some embodiments, the movable element 104A may be capable of rotation movements. In some embodiments, the movable element 104A may be capable of linear movements. In some embodiments, the movable element 104A may be capable of rotation movements and linear movements.

In some embodiments, the movable element 104A may be movable in lateral directions such that a gap distance between the movable element 104A and the remaining portions of the layer 104 changes in view of the movement. Physical quantities such as an acceleration or a rotation rate may be detected by such movements of the movable element 104A. The variation of the gap distance between the movable element 104A and the non-movable portions 104B of the layer 104 can be measured for example by detecting a change of the electric capacitance between the movable element 104A and the non-movable portions 104B of the layer 104. The physical quantity can be detected by further evaluation and processing of an electric capacitance signal in electronic circuitry. The electronic circuitry may be monolithically integrated in the MEMS device or may be provided within a separate integrated circuit device. In other embodiments, the movable element 104A may be capable to move in a vertical direction. In some embodiments, the movable element 104A may be capable to move in vertical and lateral directions.

For detection purposes, a doping process can be applied when forming the layer 104 or at a later stage of the process. The doping of the layer 104 increases the electric conductivity of the movable element 104A and the non-movable portions 104B of the layer 104 and may therefore enhance a detection of the electric capacitance between them. Electrical isolation between the movable element 104A and the non-movable portions 104B can be achieved for example by a doping process of different doping types in order to form an electrical isolating p-n junction.

It is further to be mentioned that in some embodiments transistors may be formed in transistor regions to provide an integrated circuitry for the MEMS. In particular since the described embodiments use monocrystalline layers for forming the MEMS element, transistor structures provided in processes such as bipolar, MOS, CMOS or BiCMOS processes can be formed in a transistor region lateral to the MEMS region after the MEMS element has been formed.

Figure 2:
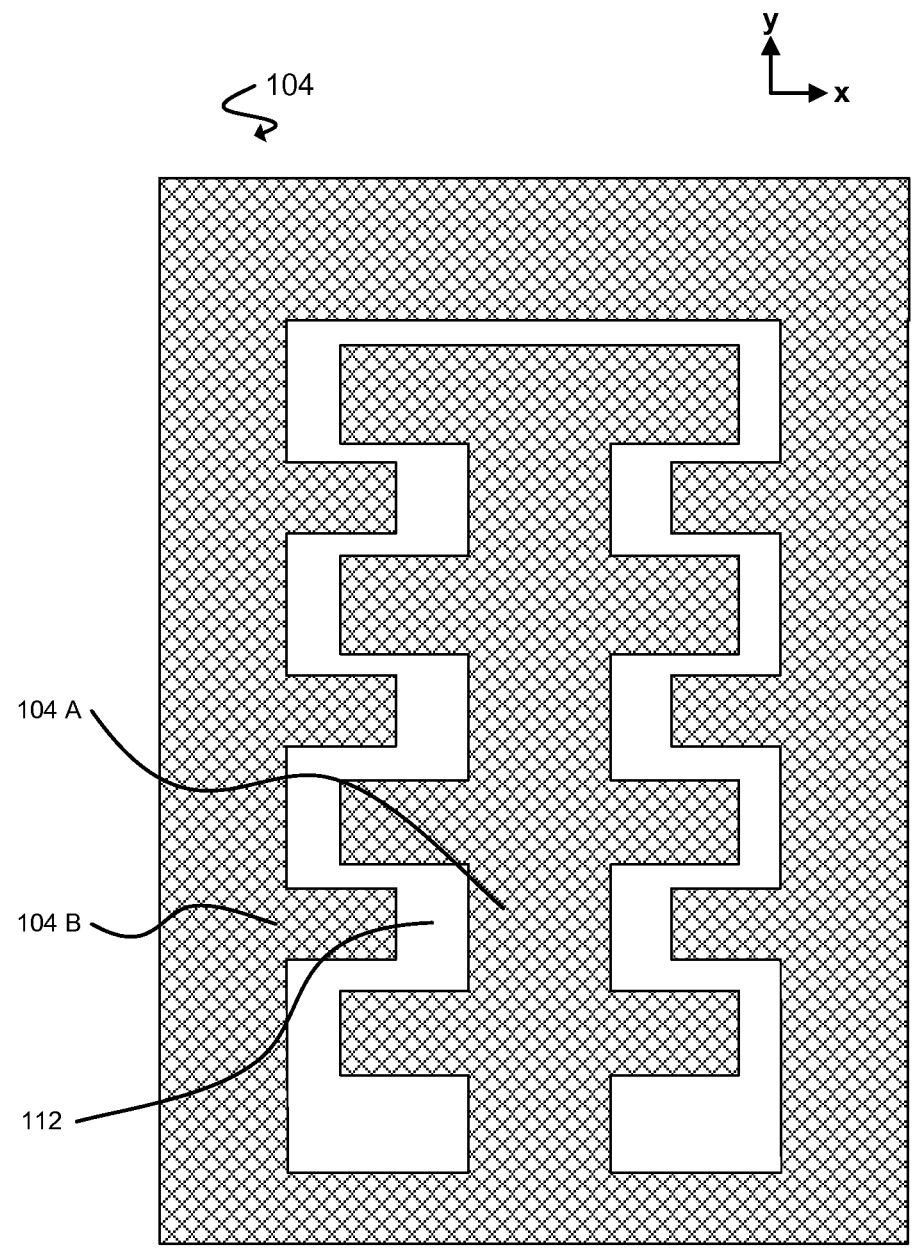
FIG. 2 shows a schematic top view of a layer according to an embodiment.

FIG. 2 shows now a schematic top view of the layer 104 in a x-y plane according to an example embodiment. FIG. 2 shows an accelerometer MEMS device that can be formed with the processes described in embodiments herein. FIG. 2 shows the movable element 104A as a beam with a plurality of fingers arranged interdigital with fingers of the non-movable portions of the layer 104 and separated by a gap defined by the channel structures 112. The movable element 104A is mechanically connected at an anchor portion to the non-movable portion 104B. It is to be noted that FIG. 2 shows only a schematic MEMS device for illustrative purpose and a variety of other types, structures sizes or forms of MEMS devices can be provided in other embodiments. For example, amongst other variations and modifications, the electrode fingers shown in FIG. 2 may in other embodiments have different size, shape and the number of fingers may be smaller or higher, the gap provided between the movable element 104A and the non-movable portion may have different sizes and the like.

Figure 5:
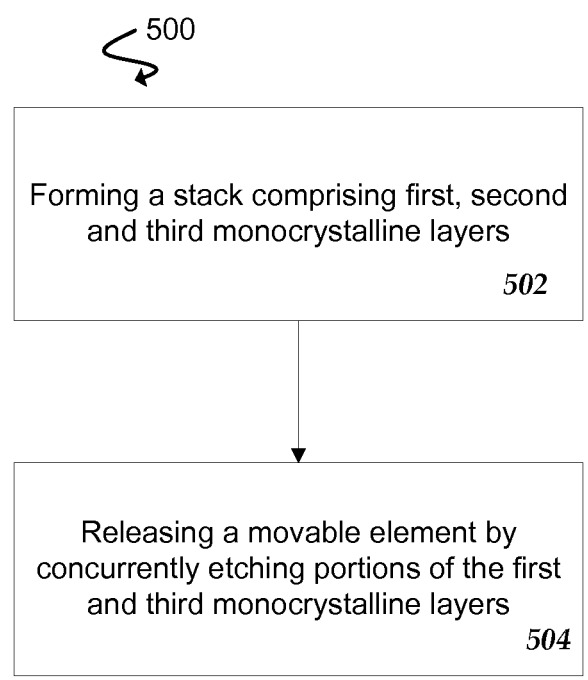
FIG. 5 shows a flow chart diagram according to an embodiment.

In FIG. 5, a flow diagram 500 for manufacturing a MEMS device in accordance with embodiments described herein is explained.

The flow diagram 500 starts at 502 with a forming of a stack comprising first, second and third monocrystalline layers (for example semiconductor layers 102, 104, 106). As described earlier, the second monocrystalline semiconductor layer is formed between the first and third monocrystalline semiconductor layers and a semiconductor material of the second monocrystalline semiconductor layer is different from semiconductor materials of the first and third monocrystalline semiconductor layers. At 504, a movable element is released by concurrently etching portions of the first and third monocrystalline layers.

In some embodiments, the first, second and third monocrystalline semiconductor layers are formed by an epitaxial growth process. In embodiments, the movable element is formed by a portion of the second monocrystalline layer. In some embodiments, the semiconductor layer stack further comprises fourth and fifth semiconductor layers (e.g. layers 108 and 110), wherein the first monocrystalline semiconductor layer is formed above the fourth semiconductor layer and wherein the fifth semiconductor layer is formed above the third monocrystalline semiconductor layer. The fourth semiconductor layer may be a semiconductor wafer substrate such as a non-SOI wafer substrate. In a vertical direction, a first gap between the fourth semiconductor layer and the second monocrystalline semiconductor layer and a second gap between the second monocrystalline semiconductor layer and the fifth semiconductor layer is formed by the etching of at least a portion of the first and third monocrystalline semiconductor layers.

In some embodiments, the second monocrystalline semiconductor layer and the fourth and fifth semiconductor layers comprise a same semiconductor material.

In some embodiments, the first and third monocrystalline semiconductor layers comprise a semiconductor material different from the second monocrystalline semiconductor layer and the fourth and fifth semiconductor layers.

In some embodiments the semiconductor crystal structure of the first and third monocrystalline semiconductor layer have a first lattice constant which is different to a second lattice constant of the semiconductor crystal structure of the second monocrystalline semiconductor layer, wherein a difference of the first and second lattice constants is not greater than X %.

In some embodiments, the first and third monocrystalline semiconductor layers comprise a compound semiconductor. According to some embodiments, a crystal structure of the second monocrystalline semiconductor layer is a non-compound semiconductor formed by a lattice arrangement of first atoms and a crystal structure of the compound semiconductor is formed by a lattice arrangement of the first atoms and second atoms. The first and second atoms may be chemical elements of a same group in the periodic table of chemical element.

As outlined above, the etching of at least a portion of each of the first and third monocrystalline semiconductor layers removes at least a portion of the first and third monocrystalline semiconductor layers above and below of a first portion of the second monocrystalline semiconductor layer while the first and third monocrystalline semiconductor layer remains above and below a second portion of the second monocrystalline semiconductor layer. It is to be noted that the etching to release the movable element can be provided from a front side (top side) avoiding backside etching and manufacturing processes.

In some embodiments, the etching is provided with no etch stop lateral to the first and third monocrystalline semiconductor layers to stop the etching of at least a portion of the first and third monocrystalline semiconductor layers.

In some embodiments, a lateral etch stop is provided lateral to at least one of the first and third monocrystalline semiconductor layers to stop the etching of at least a portion of the first and third monocrystalline semiconductor layers. An embodiment in which etch stops are used will be described further below with respect to FIGS. 4A to 4H.

In some embodiments, the etchant for etching the portions of the first and third layers and releasing the movable element is provided via channels which vertically extend at least between the first and third monocrystalline semiconductor layers. The channels may for example be formed by vertical trenches etched into the layer stack. Thus, a vertical extension of the movable MEMS element is equal to a vertical extension of the second monocrystalline semiconductor layer, wherein a vertical extension of a first gap below the movable MEMS element is equal to a vertical extension of the first monocrystalline semiconductor layer and a vertical extension of a second gap above the movable MEMS element is equal to a vertical extension of the third monocrystalline semiconductor layer.

Figure 6:
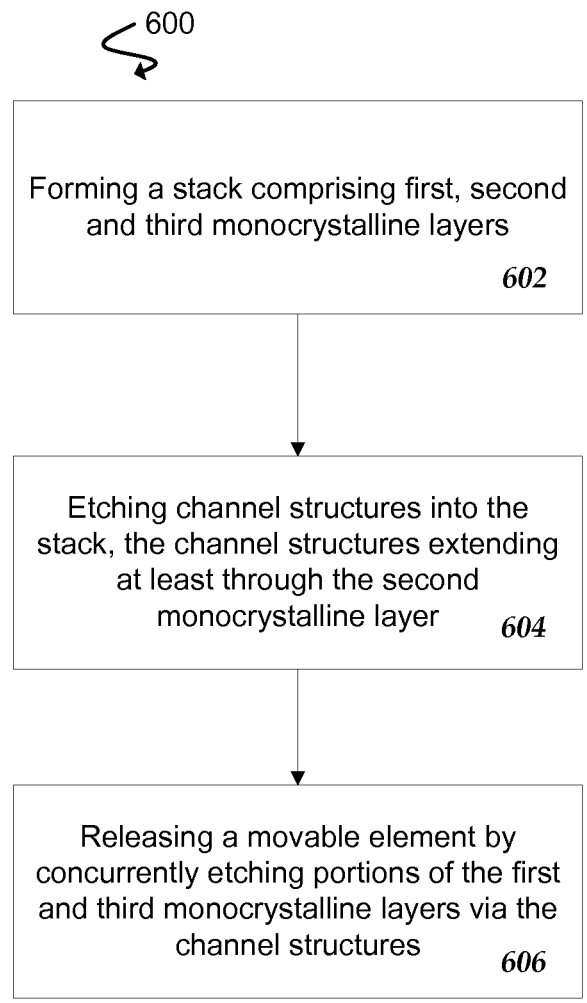
FIG. 6 shows a flow chart diagram according to an embodiment.

FIG. 6. shows a process 600 which starts at 602 with the forming of a stack comprising first, second and third monocrystalline layers. At 604, channels extending in a vertical direction at least throughout the second monocrystalline layer are etched into the stack. At 606, the movable element is released by concurrently etching portions of the first and third monocrystalline layers via the channel structures.

In some embodiments, the channels may be at least partially filled with monocrystalline semiconductor material prior to the etching of at least a portion of the first and third monocrystalline semiconductor layers as will be described below with respect to FIGS. 3A to 3H. The monocrystalline semiconductor material in the channels may be the same material as the material of at least one of the first and third monocrystalline semiconductor layers or may be of different material.

In some embodiments, a portion of the second monocrystalline layer which forms a movable element of the MEMS device may be structured prior to the etching of at least a portion of the first and third monocrystalline semiconductor layers such that gap portions at least partially surrounding the portion of the second monocrystalline layer are formed in the second monocrystalline semiconductor layer. In embodiments, the structuring of the portion of the second monocrystalline layer is provided by the etching of the channels which at least partially surround the portion forming the movable element.

In some embodiments, the releasing of the movable element is provided such that the portion of the second monocrystalline layer which forms the movable element is structured in a first etching. The first etching may be the etching of the channels as described above. After the first etching, the portion forming the movable element is mechanically connected in vertical directions to the first layer below and the third layer above the second monocrystalline layer. The movable element is then released by the removing the first and third layers.

In some embodiments, the stack comprises a fifth layer above the third layer which forms a cover for the MEMS device. Holes formed by the channels in the fifth layers may be sealed to provide a closed cavity for the movable element.

In some embodiments, the fifth layer may be sealed with monocrystalline material which allows providing an additional stack of monocrystalline layers above the fifth layer. The additional stack can be processed in a similar manner as described to form vertically above the MEMS device an additional MEMS device. Thus, a sixth monocrystalline semiconductor layer, a seventh monocrystalline semiconductor layer and a eighth monocrystalline semiconductor layer may be formed, wherein the sixth monocrystalline semiconductor layer is formed above the fifth semiconductor layer and wherein the seventh monocrystalline semiconductor layer is formed between the sixth monocrystalline semiconductor layer and the seventh monocrystalline semiconductor layer, and wherein at least a portion of the sixth and seventh monocrystalline semiconductor layers is etched to release a further movable MEMS element. It is to be understood, that the above described process allows an easily integrated process for providing vertically stacked monocrystalline MEMS devices.

In some embodiments, the channels may be at least partially filled with monocrystalline semiconductor material prior to the etching of at least a portion of the first and third monocrystalline semiconductor layers. An embodiment including such a process step will be described below with respect to FIGS. 3A to 3H.

Figure 3A:
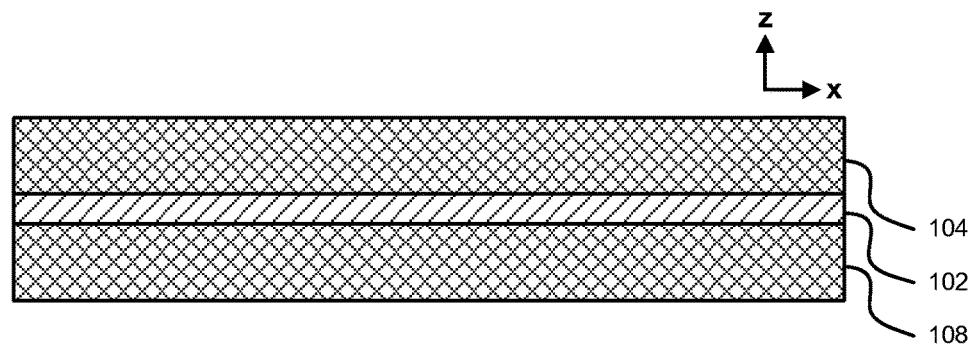
FIGS. 3A to 3H show cross-sectional views of an embodiment for manufacturing a MEMS device at various stages.
Figure 3B:
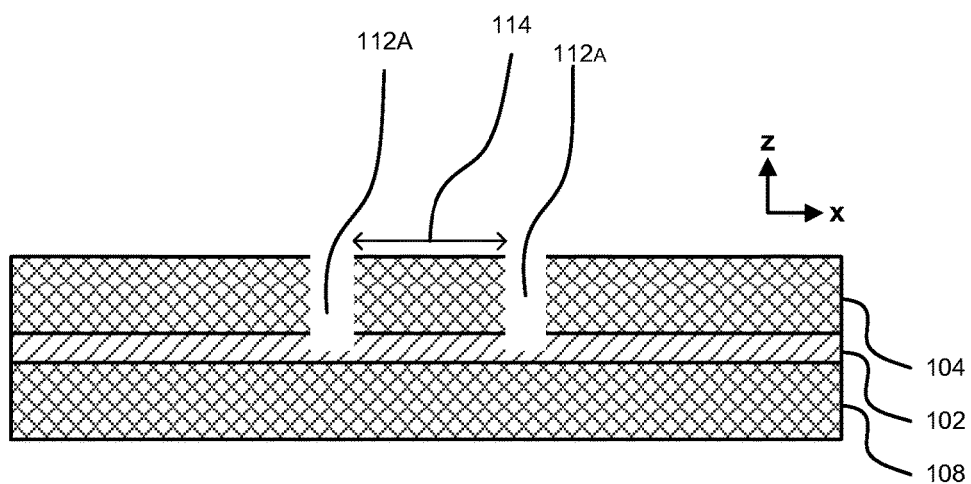
Figure 3C:
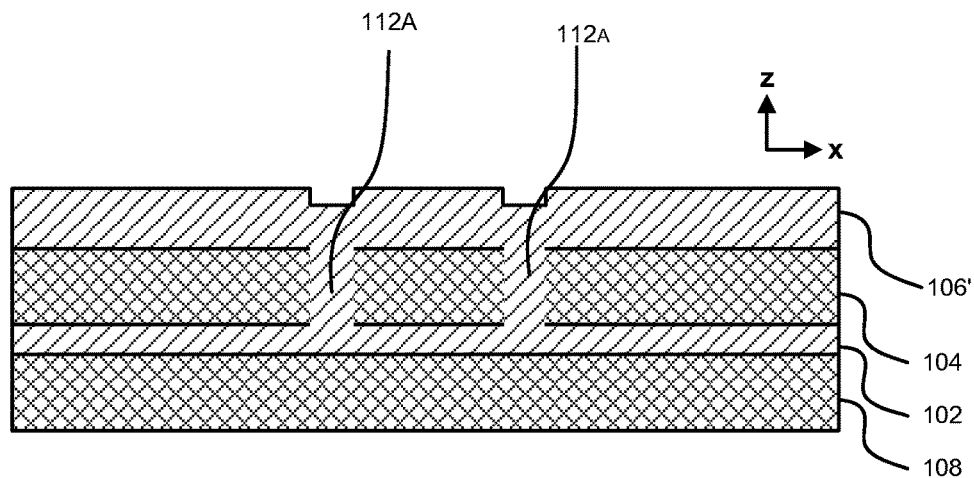
Figure 3D:
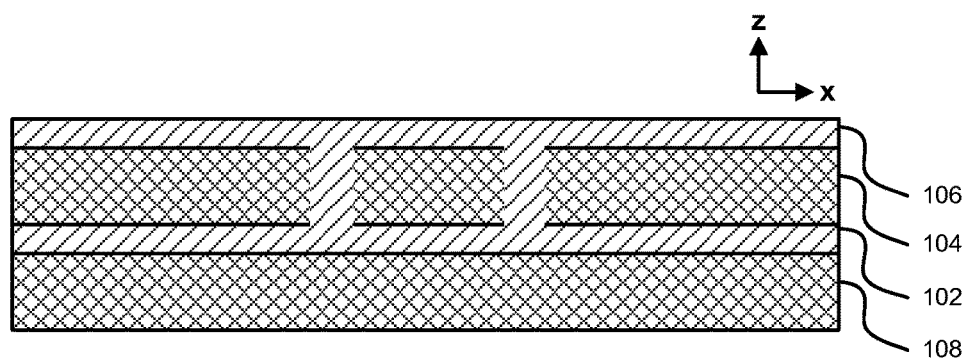
Figure 3E:
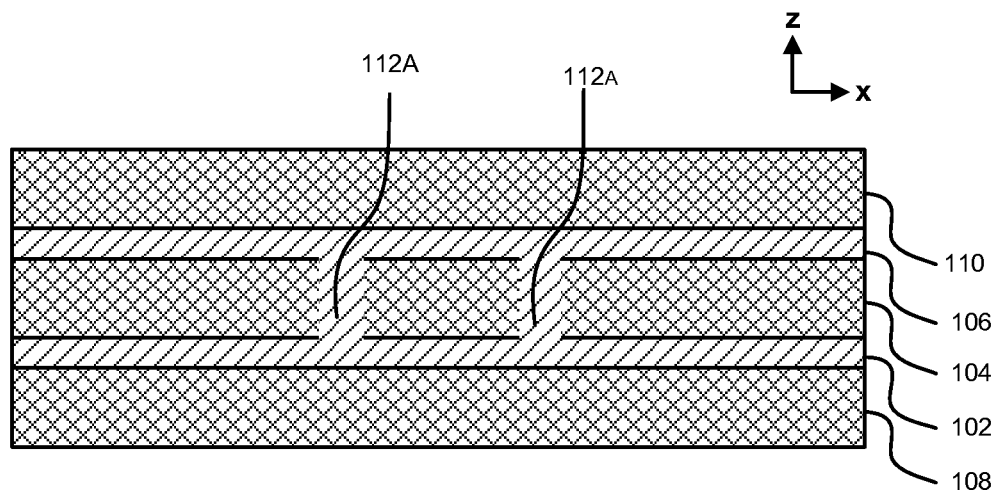
Figure 3F:
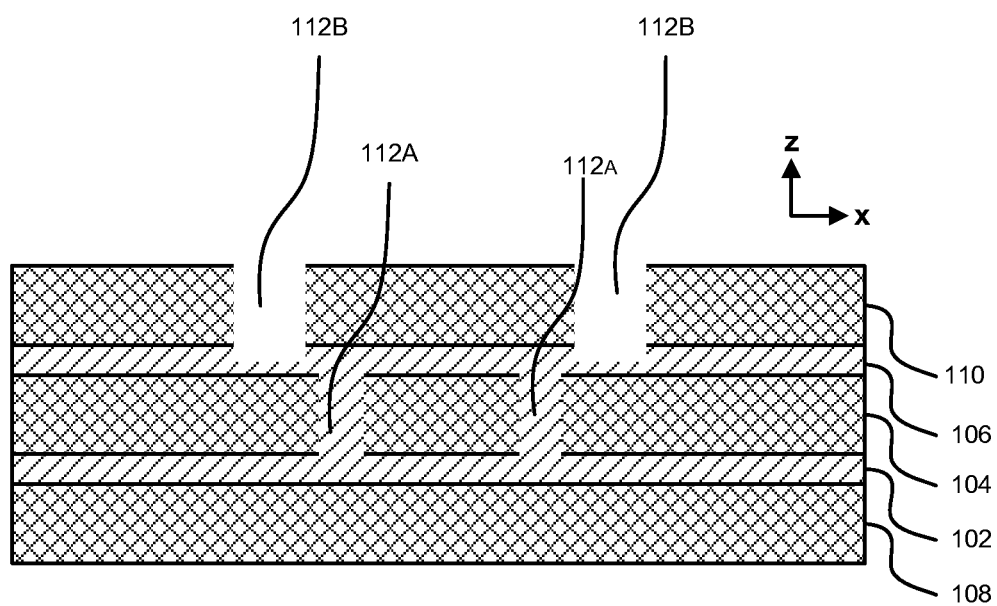

FIG. 3A starts with a layer arrangement in which the layers 102, 104 are provided on the layer 108. As already described with respect to FIG. 1A, layers 102, 104 and 108 may be monocrystalline layers formed for example by an epitaxial growth process. With reference to FIG. 3B, a channel structure 112A extending from a top surface of the layer 104 to the layer 102 is etched. In a further step, material is deposited which fills the channel structure 112A and forms a layer 106' on the layer 104 as can be seen from FIG. 3C. The layer 106' is planarized by applying techniques such as chemical mechanical polishing resulting in a planar layer 106 as shown in FIG. 3D. The layer 110 is thereafter deposited on the layer 106 as shown in FIG. 3E. Thereafter, channel structures 112B extending from a top surface of the layer 110 to the layer 106 are etched, see FIG. 3F. FIG. 3F shows the channel structures 112B lateral to the channel structures 112A. The separate forming of the channel structures 112A and 112B at different stages of the process allows the forming of the channel structures 112B extending from the layer 110 to the layer 106 at different locations than the channel structures 112A extending from the layer 106 to the layer 102. This may bring more flexibility for the MEMS manufacturing process. Such separation may for example allow tailoring the selective etching of the layers 102 and 106 according to the needs of the manufacturing process or the MEMS device since the etchant for etching the layer 102 is introduced via the channel structure 112A and for etching the layer 106 is introduced via the channel structure 112B. However, in other embodiments, the channel structures 112A and 112B may be arranged one below the other similar to the embodiment described in FIGS. 1A-1D.

Figure 3G:
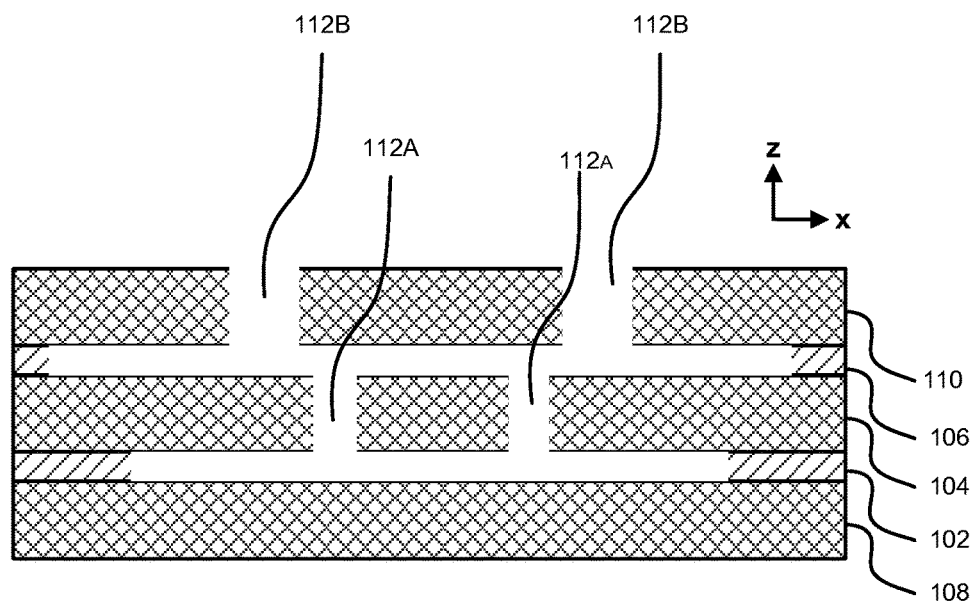

FIG. 3G shows the layers 102 and 106 after portions have been etched selective to the layer 104. In the selective etching process, the etchant for etching the layer 106 is introduced via the channel structure 112B. Furthermore, the material of the channel structure 112A is removed in the selective etching process allowing thereafter the introducing of the etchant to the layer 106 via the channel structures 112A.

Figure 3H:
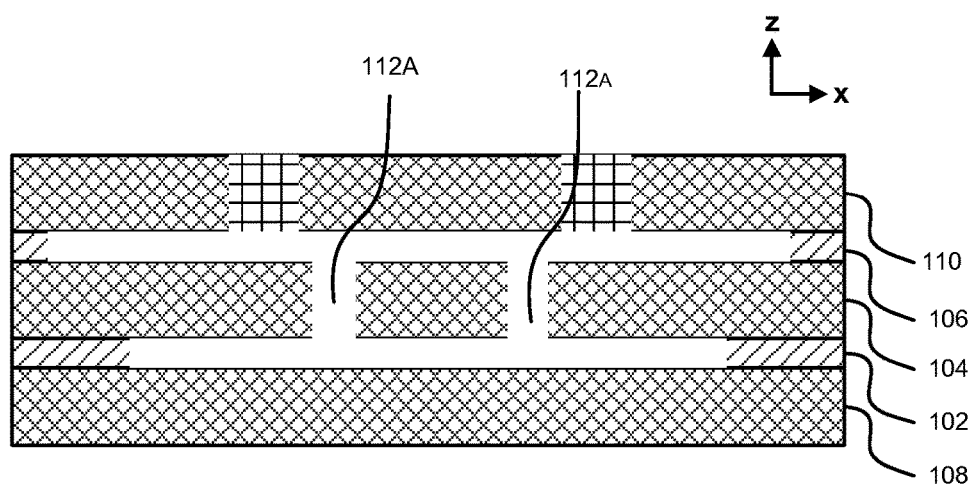

As shown in FIG. 3H, the holes of the layer 110 provided by the channel structures 112B are sealed in a similar manner as already described above with respect to FIGS. 1A-D.

Referring now to FIGS. 4A to 4H, a further example embodiment is described. The embodiment of FIGS. 4A to 4H distinguishes from previously described embodiment in that etch stops are provided lateral to the layers 102 and 106.

Figure 4A:
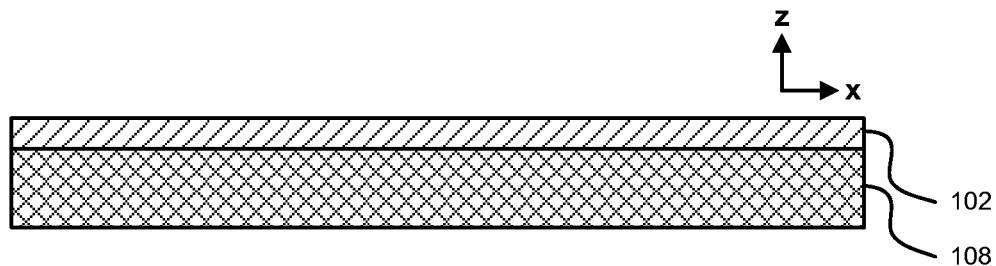
FIGS. 4A to 4H show cross-sectional views of an embodiment for manufacturing a MEMS device at various stages.
Figure 4B:
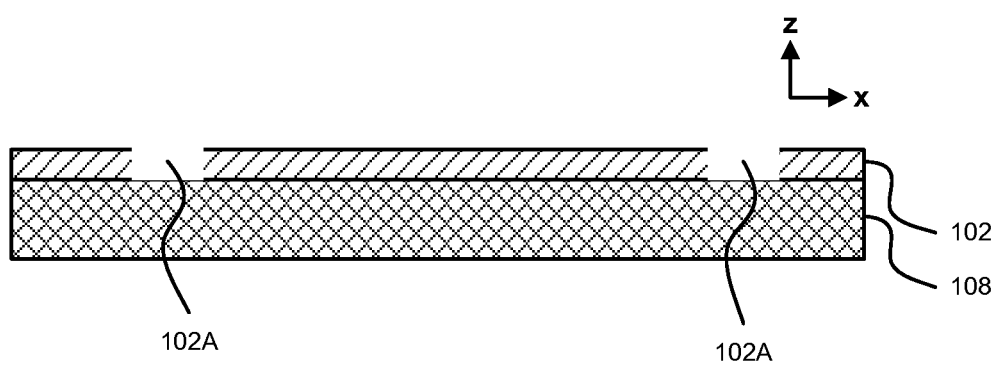

FIG. 4A starts with a layer arrangement in which the layer 102 is provided on the layer 108. Next as shown in FIG. 4B, portions of the layer 102 corresponding to first etch stop regions 102A are etched selective to the layer 108. A mask to define the first etch stop regions 102A may be provided prior to the selective etching and removed after the selective etching.

Figure 4C:
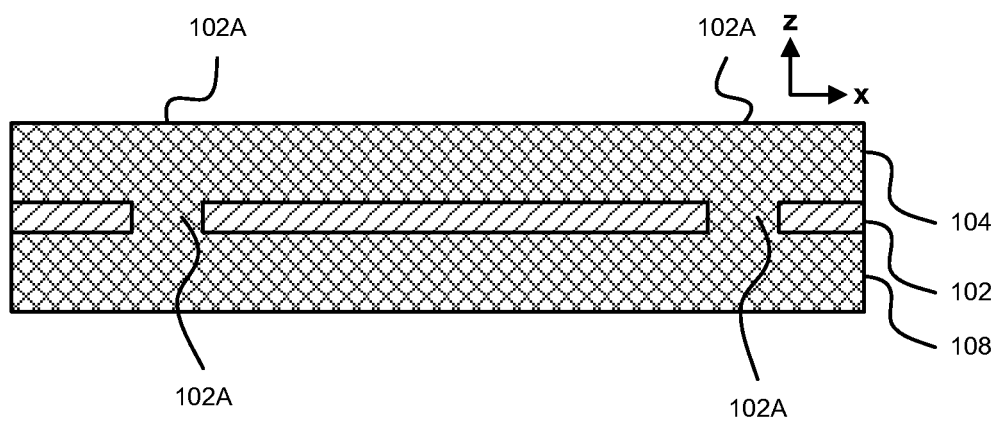

In a next step, monocrystalline material is deposited for example by epitaxial growth to fill the first etch stop regions 102A and to form the layer 104 on the layer 102. The material may be epitaxial grown in the etch stop regions 102A starting on the layer 108, and otherwise starting on the layer 102. In some embodiments, the layer 104 may have the same material as the layer 108, e.g. silicon. Since the material deposited has a lower etch rate compared to the material of the layer 102, the later applied selective etching of the layer 102 stops in vertical directions at the layers 104 and 108 and in lateral directions at the first etch stop regions 102A. A planarization process such as chemical mechanical polishing (CMP) may be applied to obtain a planar surface of the layer 104 as shown in FIG. 4C.

Figure 4D:
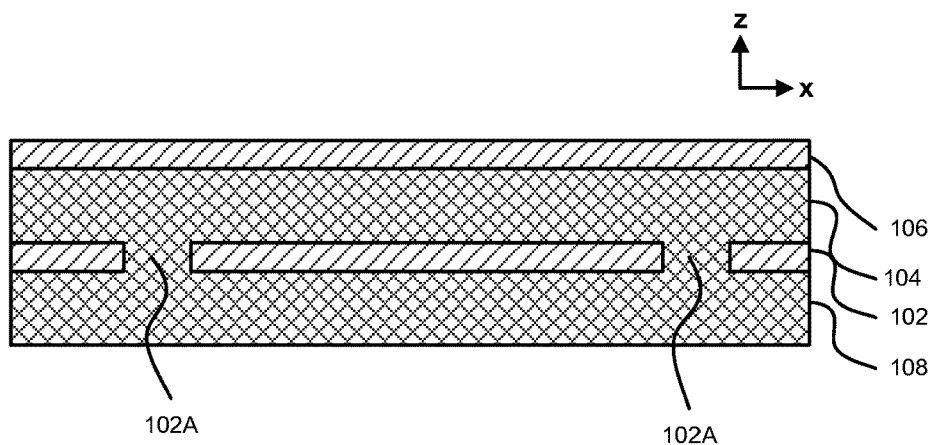
Figure 4E:
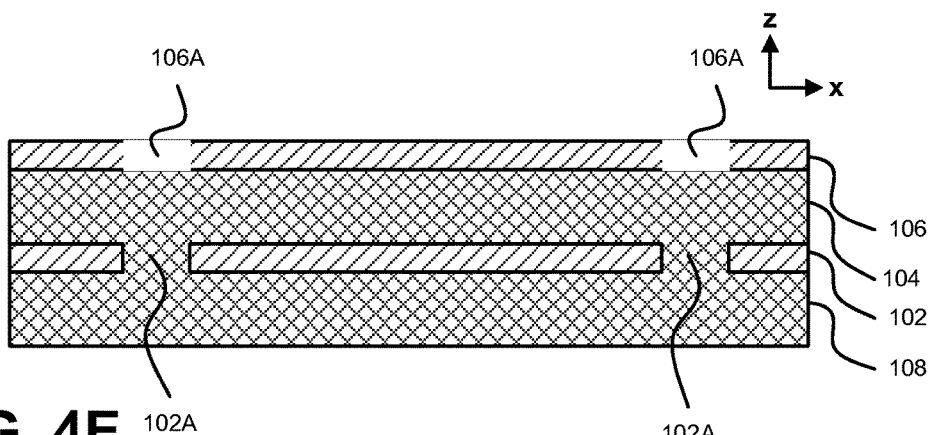

In a further step, the layer 106 is deposited on the layer 104, see FIG. 4D. Portions of the layer 106 are etched selective to the layer 104 to define second etch stop regions 106A as shown in FIG. 4E.

Figure 4F:
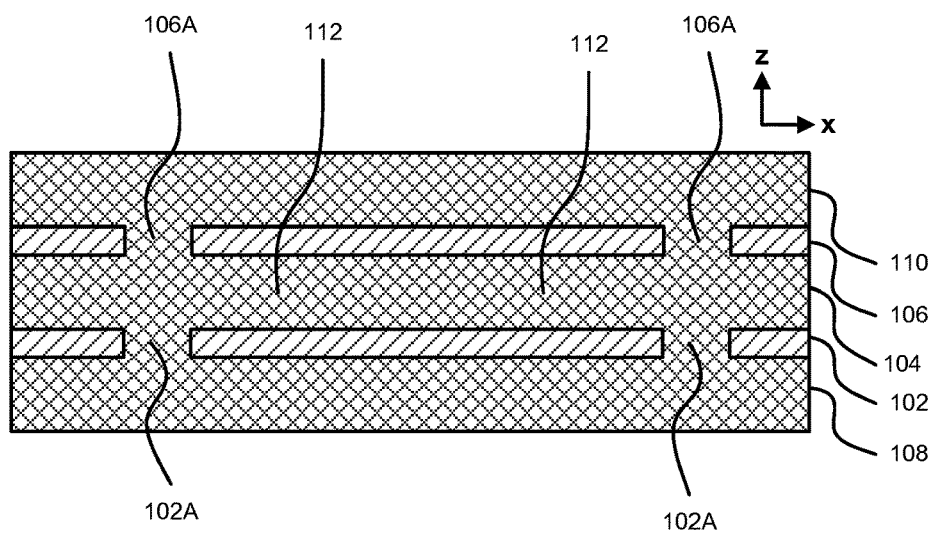
Figure 4G:
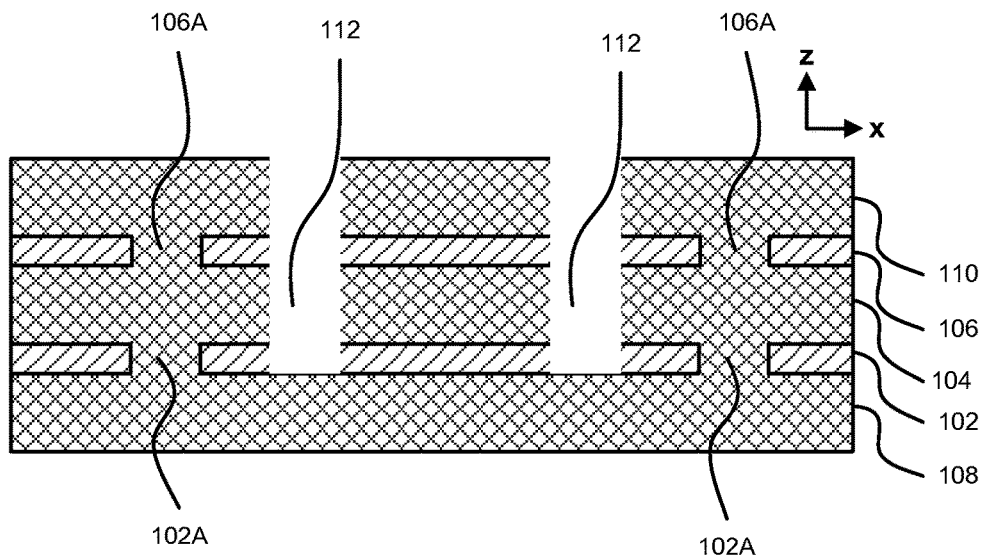
Figure 4H:
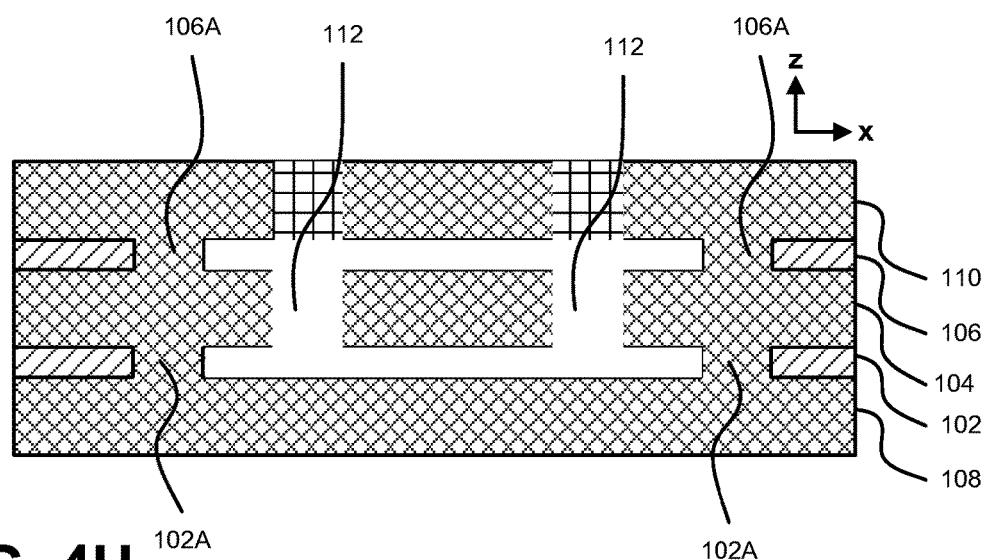

In a next step, monocrystalline material is deposited (for example by epitaxial growth) to fill the second etch stop regions 106A and to form the layer 110 on the layer 106. During deposition, the material may epitaxial grow in the second etch stop regions 106A on the layer 104 and otherwise on the layer 106. In some embodiments, the layer 110 may have the same material as the layers 104 and 108, e.g. silicon. Since the material deposited has a lower etch rate compared to the material of the layer 106, the later applied selective etching of the layer 106 stops in vertical directions at the layers 104 and 110 and in lateral directions at the second etch stop regions 106A. A planarization process such as chemical mechanical polishing (CMP) may be applied to obtain a planar surface of the layer 110 as shown in FIG. 4F. It is to be noted that the embodiment shown in FIG. 4F shows the etch stop regions 102A and 106A one below the other. However it is to be understood that in other embodiments the etch stop regions 106A may be provided lateral displaced to the etch stop regions 102A.

In a next step, the channel structures 112 are etched from a top side of the layer 110 to the layer 102 in the region between the etch stop regions 102A and 106A, respectively.

The selective etching is provided in a next step by applying the etchant via the channel structures 112 to the layers 102 and 106. The etching of the layers 102 and 106 is selective to the materials of the layers 104, 108, 110 and the etch stop regions 102A and 106A. The selective etching of the layer 102 stops in vertical directions at the layers 108 and 104 and in lateral directions at the etch stop regions 102A. Furthermore, the selective etching of the layer 106 stops in vertical directions at the layers 104 and 110 and in lateral directions at the etch stop regions 106A.

While the forming of etch stop regions 102A and 106A requires additional manufacturing steps it may be beneficial for some applications in which a precise stopping of the selective etching is desired.

Referring now to FIGS. 7A to 7E, an embodiment of manufacturing vertically stacked MEMS devices will be described. While the embodiment described in FIGS. 7A to 7E uses the process of FIGS. 1A to 1D for manufacturing stacked MEMS devices, it is to be noted that vertically stacked MEMS devices can be manufactured in accordance with any other embodiment described herein.

Figure 7A:
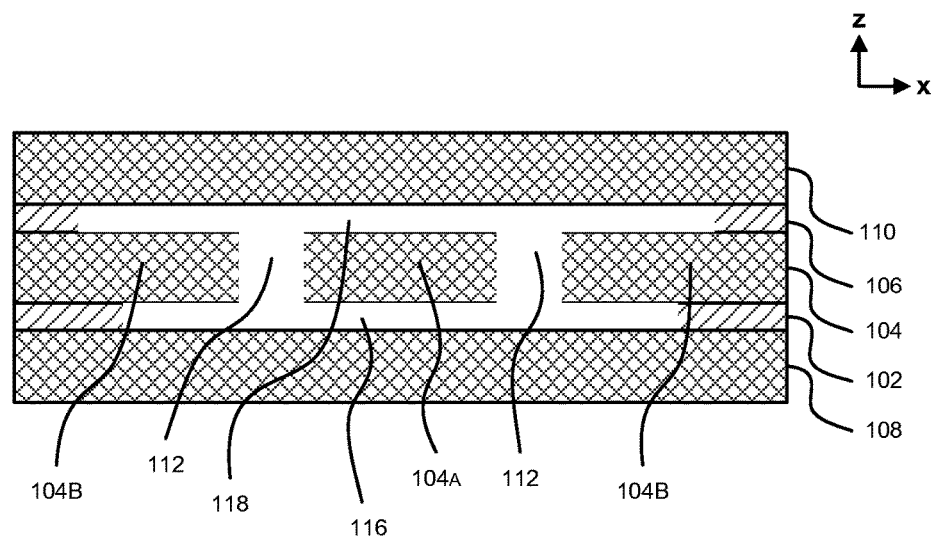
FIGS. 7A to 7E show cross-sectional views of an embodiment for manufacturing a MEMS device at various stages.
Figure 7B:
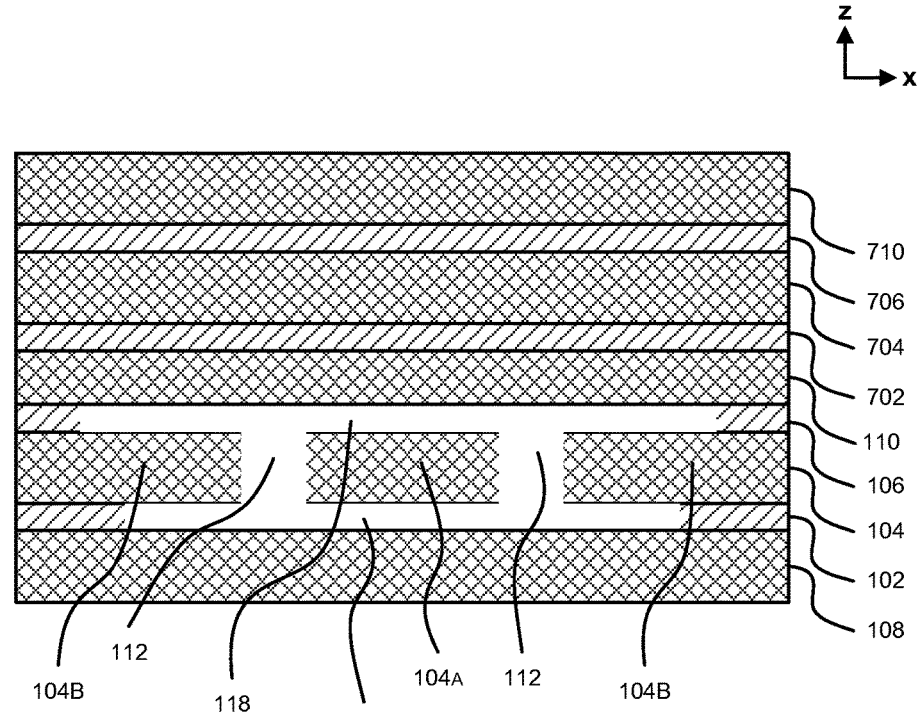

FIG. 7A shows a cross-sectional view after a MEMS device has been manufactured in accordance with FIGS. 1A to 1D. In a next step shown in FIG. 7B, a stack including the monocrystalline layers 702, 704 and 706 is grown on the monocrystalline layer 110. Furthermore, on top of layer 706, a layer 710 is provided.

Figure 7C:
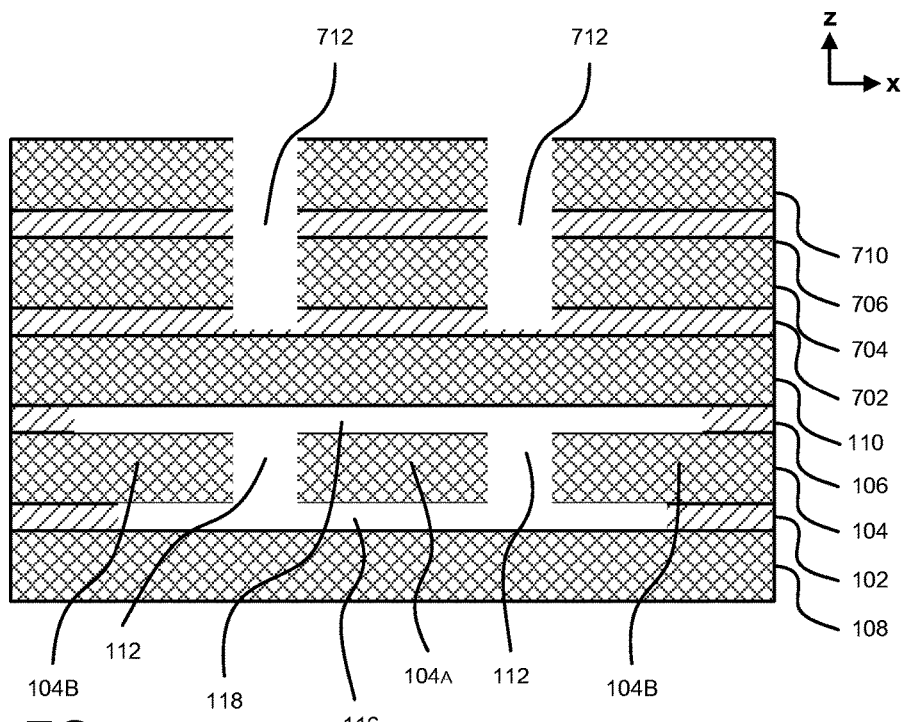
Figure 7D:
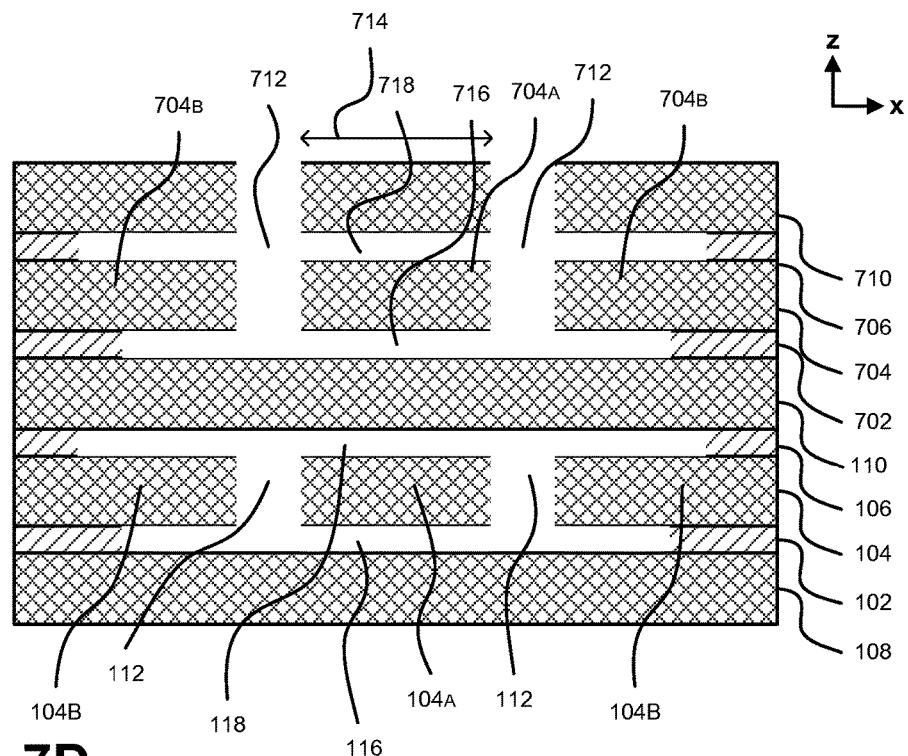

Next, channel structures 712 extending in a vertical direction are etched in the layer stack as shown in FIG. 7C in a similar manner as described above with respect to FIGS. 1A to 1D. Furthermore, similar to the embodiment of FIGS. 1A to 1D, etching of the layers 702 and 706 is performed to remove at least a portion of the layer 702 and a portion of the layer 706. The etching of the layers 702 and 706 is provided selective to the layers 110, 706 and 710, i.e. the etching rate for layers 702 and 706 is significantly higher than the etching rate for the layers 110, 706 and 710. The etchant for etching the layers 702 and 706 is provided via the channel structures 712.

The layers 702 and 706 are completely removed in a portion 714 of the layer stack between the channel structures 112. In the portion 714 of the layer stack, a first gap 716 in vertical direction is generated between the layer 110 and the layer 704 by the removing of the layer 702 in the layer stack portion 714. Furthermore, a second gap 718 is generated in a vertical direction between the layer 704 and the layer 710 by the removing of the layer 702 in the layer stack portion 714. As a result of the selective etching, a portion 704A of the layer 704 forming a movable element portion of a second MEMS device is released and the portion 704A is thereafter movable. Furthermore, portions 704B lateral to the movable element portion 704A and separated by the channel structures 712 remain after the selective etching and form non-movable portions 704B of the layer 704.

Figure 7E:
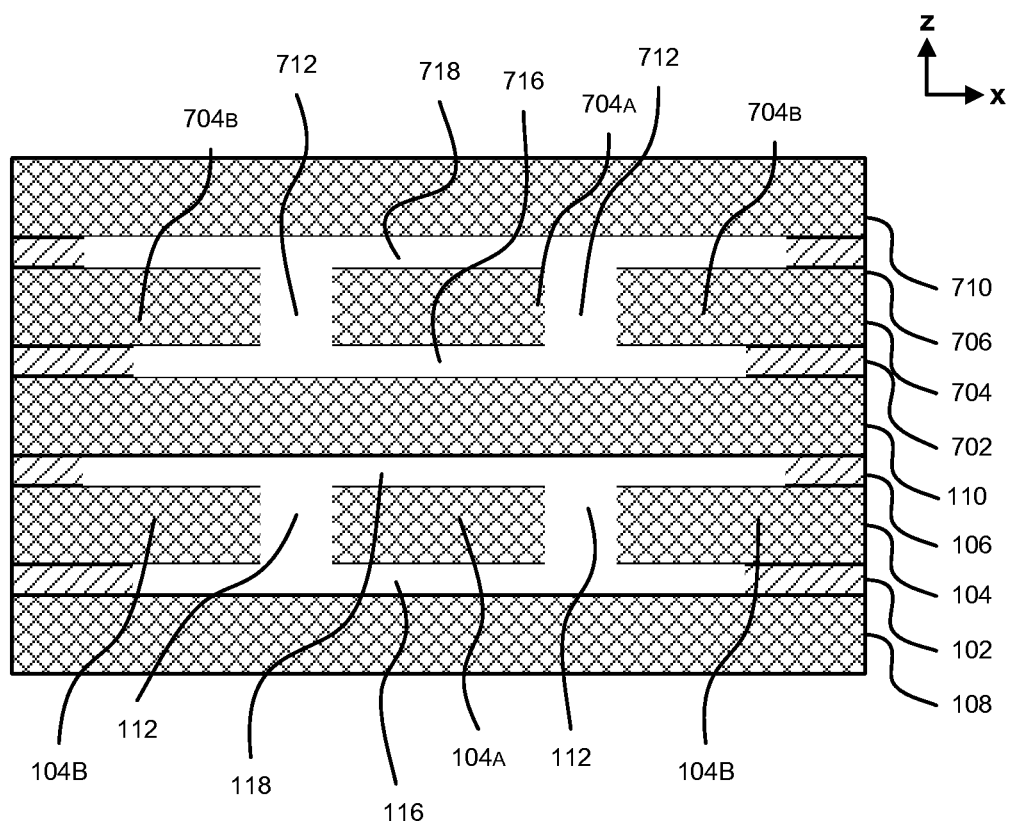

Referring to FIG. 7E, the holes provided by the channel structures 712 in the layer 710 are sealed. Sealing of the holes may include a monocrystalline grow of material, deposition of polycrystalline material or deposition of materials other than semiconductor material.

It can be seen from FIG. 7E that two vertically stacked MEMS devices comprising movable monocrystalline elements are formed with the above described process. It is to be understood that further MEMS devices can be stacked in the same manner as described. Furthermore, it is to be understood that stacked MEMS devices can be manufactured by any other embodiment described herein, for example by manufacturing in accordance with embodiments utilizing lateral etch stops as described in FIGS. 4A-4H or embodiments providing channel structures as described with respect to FIGS. 3A to 3H or any combination thereof.

In the above description, embodiments have been shown and described herein enabling those skilled in the art in sufficient detail to practice the teachings disclosed herein. Other embodiments may be utilized and derived there from, such that structural and logical substitutions and changes may be made without departing from the scope of this disclosure.

This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

It is further to be noted that embodiments described in combination with specific entities may in addition to an implementation in these entity also include one or more implementations in one or more sub-entities or sub-divisions of said described entity. For example, specific embodiments described herein describe the forming of a feature or a process step not shown in another embodiment. It is to be understood that such a feature may be formed also in other embodiments or such a process step may be applied also in other embodiments, unless it is explicitly excluded herein or technically not possible.

The accompanying drawings that form a part hereof show by way of illustration, and not of limitation, specific embodiments in which the subject matter may be practiced.

In the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

Furthermore, it is intended to include in this detailed description also one or more of described features, elements etc. in a reversed or interchanged manner unless otherwise noted.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons.

Furthermore, in some embodiments a single step may include or may be broken into multiple substeps. Such substeps may be included and part of the disclosure of this single step unless explicitly excluded.

What is claimed is:

1. A method for producing a MEMS device, comprising:
   forming a semiconductor layer stack, the semiconductor layer stack comprising at least a first monocrystalline semiconductor layer, a second monocrystalline semiconductor layer, a third monocrystalline semiconductor layer, a fourth monocrystalline semiconductor layer, and a fifth monocrystalline semiconductor layer, the second monocrystalline semiconductor layer formed between the first and third monocrystalline semiconductor layers, the first monocrystalline semiconductor layer being formed above the fourth monocrystalline semiconductor layer and the fifth monocrystalline semiconductor layer being formed above the third monocrystalline semiconductor layer, wherein a semiconductor material of the second monocrystalline semiconductor layer is different from semiconductor materials of the first and third monocrystalline semiconductor layers, at least one layer of the semiconductor layer stack includes a compound semiconductor material and at least one layer of the semiconductor layer stack includes a non-compound semiconductor material, and adjacent layers of the first, the second, and the third monocrystalline semiconductor layers have mutual different doping types;
   etching the first, the second, the third, and the fifth monocrystalline semiconductor layers to form channels extending from the fifth monocrystalline semiconductor layer to the first monocrystalline semiconductor layer and terminating within the first monocrystalline semiconductor layer;
   etching, via the channels, the first and the third monocrystalline semiconductor layers, wherein a movable first portion of the second monocrystalline semiconductor layer forming a movable MEMS element is released by removing a first portion of the first monocrystalline semiconductor layer and a first portion of the third monocrystalline semiconductor layer, second and third portions of the first monocrystalline semiconductor layer remaining below respective second and third portions of the second monocrystalline semiconductor layer, and second and third portions of the third monocrystalline semiconductor layer remaining above the second and the third portions of the second monocrystalline semiconductor layer, the movable first portion of the second monocrystalline semiconductor layer being separated laterally by gaps defined by the channels and vertically by gaps defined by the removed first portion of the first monocrystalline semiconductor layer between the fourth monocrystalline semiconductor layer and the second monocrystalline semiconductor layer and the removed first portion of the third monocrystalline semiconductor layer between the second monocrystalline semiconductor layer and the fifth monocrystalline semiconductor layer; and
   providing a monocrystalline semiconductor material in a portion of the channels within the fifth monocrystalline semiconductor layer to seal the channels.

2. The method according to claim 1, wherein the first, second and third monocrystalline semiconductor layers are epitaxial grown monocrystalline semiconductor layers.

3. The method according to claim 1, wherein the second monocrystalline semiconductor layer and the fourth and fifth semiconductor layers comprise a same semiconductor material.

4. The method according to claim 3, wherein the first and third monocrystalline semiconductor layers comprise a semiconductor material different from a semiconductor material of the second monocrystalline semiconductor layer and the fourth and fifth semiconductor layers.

5. The method according to claim 1, wherein a semiconductor crystal structure of the first and third monocrystalline semiconductor layers have a first lattice constant which is different to a second lattice constant of a semiconductor crystal structure of the second monocrystalline semiconductor layer, wherein a difference of the first and second lattice constants is not greater than 10%.

6. The method according to claim 5, wherein the first and third monocrystalline semiconductor layers comprise the compound semiconductor material.

7. The method according to claim 6, wherein a crystal structure of the second monocrystalline semiconductor layer is formed by a lattice arrangement of first atoms and a crystal structure of the compound semiconductor material is formed by a lattice arrangement of the first atoms and second atoms.

8. The method according to claim 7, wherein the first and second atoms are chemical elements of a same group within a periodic table of chemical elements.

9. The method according to claim 1, wherein the etching of the first portion of each of the first and the third monocrystalline semiconductor layers removes at least a portion of the first and the third monocrystalline semiconductor layers below and above a first portion of the second monocrystalline semiconductor layer, respectively, while the first and the third monocrystalline semiconductor layers remain below and above a second portion of the second monocrystalline semiconductor layer, respectively, and wherein the channels separate the first portion of the second monocrystalline semiconductor layer into the movable portion of the second monocrystalline semiconductor layer and a non-movable portion of the first portion of the second monocrystalline semiconductor layer.

10. The method according to claim 9, wherein no etch stop is provided lateral to the first and third monocrystalline semiconductor layers to stop the etching of at least a portion of the first and third monocrystalline semiconductor layers.

11. The method according to claim 1, wherein a lateral etch stop is provided lateral to at least one of the first and third monocrystalline semiconductor layers to stop the etching of at least a portion of the first and third monocrystalline semiconductor layers.

12. The method according to claim 1, wherein an etchant is provided via the channels.

13. The method according to claim 12, further comprising at least partially filling the channels with monocrystalline semiconductor material prior to the etching of the first portion of the first monocrystalline semiconductor layer and the first portion of the third monocrystalline semiconductor layer.

14. The method according to claim 13, wherein the monocrystalline semiconductor material in the channels comprises a same material as the material of at least one of the first and third monocrystalline semiconductor layers.

15. The method according to claim 1, wherein the second monocrystalline semiconductor layer is structured prior to the etching of the first portions of the first and the third monocrystalline semiconductor layers such that gap portions at least partially surrounding the movable portion of the second monocrystalline layer are formed in the second monocrystalline semiconductor layer.

16. The method according to claim 15, wherein forming the semiconductor stack comprises: epitaxial growing the second monocrystalline semiconductor layer on the first monocrystalline semiconductor layer; structuring the second monocrystalline semiconductor layer such that gap portions are formed by removing at least a portion of the second monocrystalline semiconductor layer; providing an epitaxial grow process to form the third monocrystalline semiconductor layer above the second monocrystalline semiconductor layer and to fill the gap portions with epitaxial grown semiconductor material; etching at least a portion of each of the first and third monocrystalline semiconductor layers and at least a portion of the epitaxial grown semiconductor material in the gap portions.

17. The method according to claim 12, wherein the channels at least partially surround the movable portion of the second monocrystalline semiconductor layer.

18. The method according to claim 1, wherein the sealed fifth monocrystalline semiconductor layer forms a cover of the MEMS device.

19. The method according to claim 1, further comprising:
forming a sixth monocrystalline semiconductor layer, a seventh monocrystalline semiconductor layer and an eighth monocrystalline semiconductor layer,
wherein the sixth monocrystalline semiconductor layer is formed above the fifth monocrystalline semiconductor layer and wherein the seventh monocrystalline semiconductor layer is formed between the sixth monocrystalline semiconductor layer and the eighth monocrystalline semiconductor layer, and
wherein at least a portion of the sixth and eighth monocrystalline semiconductor layers is etched to release a further movable MEMS element.

20. The method according to claim 13, wherein the monocrystalline semiconductor material that at least partially fills the channels is a portion of the first monocrystalline semiconductor layer.

21. The method according to claim 1, wherein the first monocrystalline semiconductor layer is only partially etched such that the channels terminate within the first monocrystalline semiconductor layer.

22. The method according to claim 1, wherein the channels have a channel width and the first monocrystalline semiconductor layer has a layer thickness, wherein a ratio of the channel width to the layer thickness is selected to control the etching of the first and the third monocrystalline semiconductor layers.

23. The method according to claim 1, wherein the etching of the first and the third monocrystalline semiconductor layers via the channels removes greater amounts of the second and third portions of the third monocrystalline semiconductor layer than amounts of the second and third portions of the first monocrystalline semiconductor layer.

24. The method according to claim 1, wherein the etching of the first and the third monocrystalline semiconductor layers comprises providing an etchant via the channels in a direction from the fifth monocrystalline semiconductor layer to the first monocrystalline semiconductor layer to remove greater amounts of the second and third portions of the third monocrystalline semiconductor layer than amounts of the second and third portions of the first monocrystalline semiconductor layer.

25. The method according to claim 1, wherein:
the second and the third portions of the first monocrystalline semiconductor layer, and the second and the third portions of the second monocrystalline semiconductor layer are laterally disposed with respect to the movable MEMS element such that the movable MEMS element is positioned between the second and the third portions of the first monocrystalline semiconductor layer and the second and the third portions of the second monocrystalline semiconductor layer; and
the channels separate the movable MEMS from the second and the third portions of the first monocrystalline semiconductor layer and the second and the third portions of the second monocrystalline semiconductor layer.

26. The method according to claim 1, wherein the first and third monocrystalline semiconductor layers comprise the compound semiconductor material and the second monocrystalline semiconductor layer comprises the non-compound semiconductor material.

27. The method according to claim 1, wherein the compound semiconductor material comprises two or more different chemical elements and the non-compound semiconductor material comprises a single chemical element.

28. The method according to claim 1, wherein the first and the third monocrystalline semiconductor layers are p-doped, and the second monocrystalline semiconductor layer is n-doped.

29. The method according to claim 1, wherein the first and the third monocrystalline semiconductor layers are n-doped, and the second monocrystalline semiconductor layer is p-doped.

* * * * *